US007364009B2

(12) United States Patent
Sperle et al.

(10) Patent No.: US 7,364,009 B2
(45) Date of Patent: Apr. 29, 2008

(54) LOUDSPEAKER MOUNTING FRAME, LOUDSPEAKER AND CABINET COMPRISING A LOUDSPEAKER

(75) Inventors: Cornelius Sperle, Le Thoureil (FR); Patrice Fremanteau, Villeveque (FR); Gilles Bourgoin, Angers (FR)

(73) Assignee: Thomson Licensing, Boulogne Billancourt (FR)

( * ) Notice: Subject to any disclaimer, the term of this patent is extended or adjusted under 35 U.S.C. 154(b) by 425 days.

(21) Appl. No.: 10/836,541

(22) Filed: Apr. 30, 2004

(65) Prior Publication Data

US 2005/0241876 A1 Nov. 3, 2005

(51) Int. Cl.
*H05K 5/02* (2006.01)
*H04R 1/02* (2006.01)
*H04R 7/16* (2006.01)

(52) U.S. Cl. ...................... 181/150; 181/154; 181/171; 381/389; 381/391; 381/395; 381/86

(58) Field of Classification Search ................ 181/150, 181/148, 154, 171, 199; 381/386, 389, 291, 381/395, 336, 305, 86, 391
See application file for complete search history.

(56) References Cited

U.S. PATENT DOCUMENTS

| | | | | |
|---|---|---|---|---|
| 4,032,725 | A * | 6/1977 | McGee | 381/395 |
| 4,152,544 | A * | 5/1979 | Sanpei et al. | 181/199 |
| 4,166,933 | A | 9/1979 | Cinquino | |
| D256,915 | S * | 9/1980 | Needleman | D14/224 |
| 4,602,382 | A | 7/1986 | Gabbay et al. | |
| 4,852,178 | A * | 7/1989 | Inkman et al. | 381/395 |
| 5,117,938 | A * | 6/1992 | Whanhaeng | 181/148 |
| 5,168,527 | A * | 12/1992 | Loya | 381/395 |
| 5,414,229 | A * | 5/1995 | Rocheleau et al. | 181/150 |
| 5,608,809 | A | 3/1997 | Ueda | |
| 5,647,007 | A * | 7/1997 | Wooderson et al. | 381/332 |
| 5,682,290 | A * | 10/1997 | Markow et al. | 361/683 |
| 5,734,732 | A * | 3/1998 | Lemmon | 381/386 |
| 5,739,481 | A * | 4/1998 | Baumhauer et al. | 181/148 |
| 6,061,460 | A * | 5/2000 | Seo | 381/388 |
| 6,456,722 | B1 * | 9/2002 | Davey et al. | 381/389 |
| 6,675,930 | B2 * | 1/2004 | Sugiyama et al. | 181/148 |
| 6,918,462 | B2 * | 7/2005 | Benkler | 181/150 |
| 2005/0047604 | A1 * | 3/2005 | Wright | 381/12 |

FOREIGN PATENT DOCUMENTS

JP 58003390 1/1983

OTHER PUBLICATIONS

Search Report for EPO Appln. No. 03 29 1046 dated Mar. 11, 2004.

* cited by examiner

*Primary Examiner*—Edgardo San Martin
(74) *Attorney, Agent, or Firm*—Joseph J. Laks; Harvey D. Fried; Patricia Verlangieri

(57) ABSTRACT

A loudspeaker mounting frame (1) for an electronic appliance has a central opening for receiving a loudspeaker membrane (24), and a plurality of through holes (11) surrounding said central opening for receiving fixing means (25). The through holes (11) are tapered so as to accommodate the fixing means (25) in varying orientations. Spherical bosses (6) surrounding said through holes (11) are formed at a rear side (5) of the mounting frame (1).

12 Claims, 3 Drawing Sheets

LOUDSPEAKER MOUNTING FRAME, LOUDSPEAKER AND CABINET COMPRISING A LOUDSPEAKER

BACKGROUND OF THE INVENTION

The present invention relates to a loudspeaker mounting frame for mounting a loudspeaker in a cabinet of an electronic device such as a radio, a television set or any other type of audio or audio/video appliance. It further relates to a loudspeaker and to a cabinet comprising such a mounting frame.

Conventionally, electromagnetic loudspeakers have a sound-radiating membrane of roughly frusto-conical shape, the outer rim of which is fixed to a rigid support ring. Webs extending from this support ring hold an electromagnet for driving the vibrations of the membrane in position at the small base of the frusto-conical membrane. In this support ring, a plurality of holes is formed. Such a loudspeaker is usually installed by placing its rear side on a carrier and driving screws through the holes into the carrier.

In order to protect the loudspeaker membrane from damage, it should be covered by a sound-transmission hood such as a stretched fabric or a perforated shell that will let the sound from the loudspeaker pass to the outside but will prevent outside objects from reaching the membrane and damaging it. The distance between the membrane and the hood should be kept small in order to prevent an unwanted dampening of trebles.

A loudspeaker assembly comprising a carrier and a hood as described above is complicated and expensive to produce.

It might therefore be contemplated to simplify such an assembly by using a stiff perforated shell as the protective hood and to provide receiving portions in this shell for receiving the shafts of screws by which the loudspeaker is screwed to the shell.

Such a solution is unsatisfying for various reasons. One reason is that the shaft receiving portions must be located between the shell and the support ring of the loudspeaker, whereby the distance between the shell and the loudspeaker is increased by the length of the shafts, at minimum, and reproduction of trebles is impaired. Another reason is that modern electronic appliances frequently have a freely curved shape. If such a shape is formed by moulding, bores of the shaft receiving portions must be parallel to the direction of displacement of the mould elements in the moulding process, because otherwise moulds having a high number of movable elements are required. However, this direction of displacement is not necessarily perpendicular to a mounting plane of the loudspeaker. If it is not, fixing screws will extend through the holes of the support ring at non-perpendicular angles, making the assembly awkward and irreproducible.

BRIEF SUMMARY OF THE INVENTION

The invention aims at providing a technique for mounting a loudspeaker in an electronic appliance cabinet in which at least some of the problems of the prior art are avoided.

In a first instance, the invention proposes a loudspeaker mounting frame having a central opening for receiving a loudspeaker membrane and a plurality of through holes surrounding said central opening for receiving a fixing means for fixing the mounting frame to a cabinet, wherein said through holes are tapered. The tapered shape allows for fixing means such as pins or screws to extend through the through holes in various directions without risk of interference, so that the frame may be easily and reproducibly mounted in a variety of oblique orientations that may be required by a convex shape of the cabinet in which the loudspeaker is installed.

A tapering angle of the through holes of 5° to 15° has proved suitable.

In a second instance, the invention proposes a loudspeaker mounting frame, preferably a frame as defined above, having a central opening for receiving a loudspeaker membrane and a plurality of through holes that extend between front and rear main surfaces surrounding said central opening for receiving fixing means, wherein said mounting frame has a number of bosses formed on at least one of said main surfaces, and said through holes extend through said bosses. Conventionally, if a workpiece is fixed to a support using a screw extending through a bore of the workpiece, and the screw is not perpendicular to the surface surrounding the bore, the screw head will not lie flat on the surface surrounding the bore, but instead, only a point contact will arise. This point contact can exercise considerable torque on the screw, so that in order to achieve a solid mount, a long thread of the screw is necessary. According to the invention by providing a boss surrounding each through hole, a contact between the surface of the boss and the head of the screw will be close to the screw shaft, so that torque is small and a solid mount can be achieved using a short thread.

Preferably, the bosses have the shape of sphere segments.

In order to achieve a contact between a screw head and the boss close to the shaft of the screw, it is preferable that the narrow side of a tapered through hole through which the screw extends is formed at the same surface of the mounting frame as the bosses.

The invention also proposes a loudspeaker comprising a mounting frame as defined above and a sound-emitting membrane mounted in the central opening of said mounting frame. In that case, the mounting frame may be integrally combined with the loudspeaker support ring as defined above, i.e., the loudspeaker membrane may be connected directly to an edge of the central opening of the mounting frame. On the other hand, the loudspeaker support ring and the mounting frame might be two different parts, the membrane being directly connected to the support ring and the support ring being mounted in the central opening of the mounting frame.

The invention also proposes a loudspeaker cabinet having a support structure to which a loudspeaker mounting frame as defined above or a loudspeaker as defined above is mounted, and a perforated shell facing the sound-emitting membrane of such a loudspeaker.

For a quick and easy assembly of the loudspeaker cabinet, it is preferred that the support structure has at least one pin matingly engaging one of said through holes of the mounting frame and at least one bore aligned with another one of said through holes for receiving a fixing bolt inserted through said through hole. With such a design, it is possible first to engage the mounting frame with said at least one pin, so that it is temporarily held, and then to finish the assembly by fixing said at least one bolt.

As already indicated above, the head of the bolt should come into contact with the surface of one of said bosses.

In order to keep the design of the cabinet simple, the support structure and perforated shell may be the same part. Since the bolts must not emerge at the front side of the perforated shell, the shell is preferably provided with a number of stubs formed on it, the stubs having resting surfaces which are in contact with the mounting frame, and the at least one mating pin and the at least one bore are formed at one of said resting surfaces, respectively. Since the head of the bolt is in contact with the surface of the boss surrounding the through hole in which it is inserted, the torque acting on the bolt is small, so that a short shaft of the bolt is sufficient for a solid fixation. Accordingly, the stubs may also be kept short, thus keeping the distance between the loudspeaker membrane and the perforated shell short, which, in turn, is favourable for reproduction of trebles.

A further possible feature for decreasing the distance between the loudspeaker membrane and the perforated shell is that a mounting surface portion of the mounting frame—to which a loudspeaker membrane may be fixed directly or via a support ring, as indicated above—surrounding the central opening is located between a plane defined by the tips of the stubs protruding from the perforated shell and the perforated shell itself.

DESCRIPTION OF THE DRAWINGS

Further objects, features and advantages of the present invention will become apparent from the subsequent description of specific embodiments referring to the drawings.

DESCRIPTION OF PREFERRED EMBODIMENTS

Figure 1:
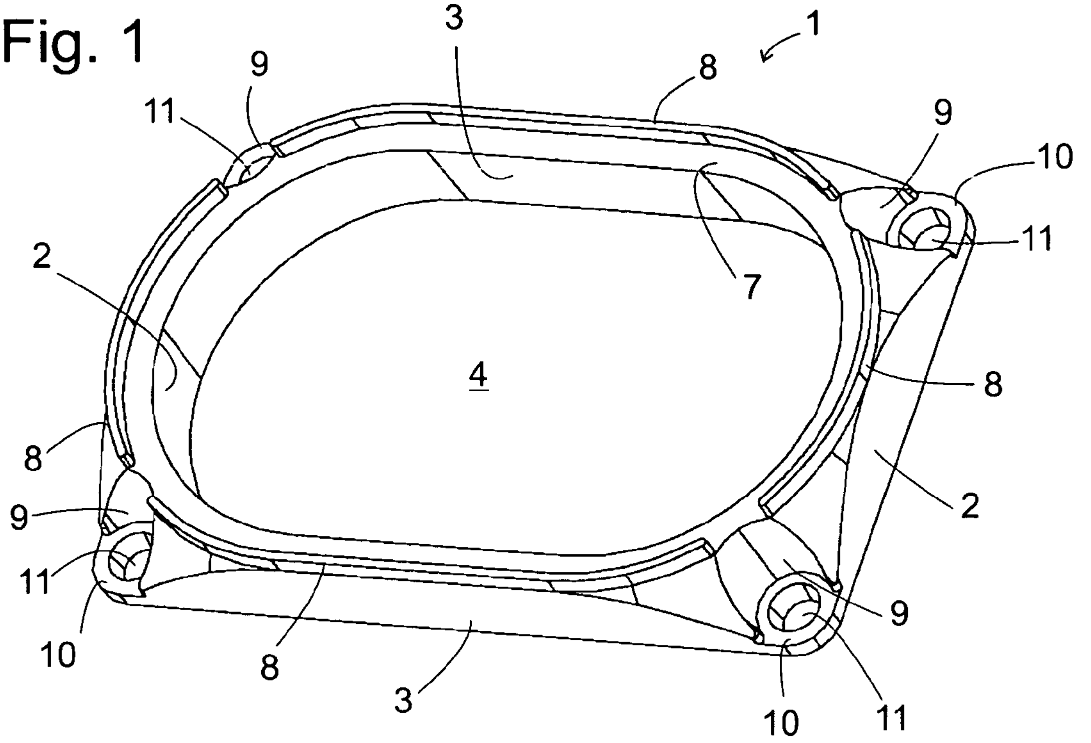
FIG. 1 is a perspective front view of a loudspeaker mounting frame according to a first embodiment of the invention.
Figure 2:
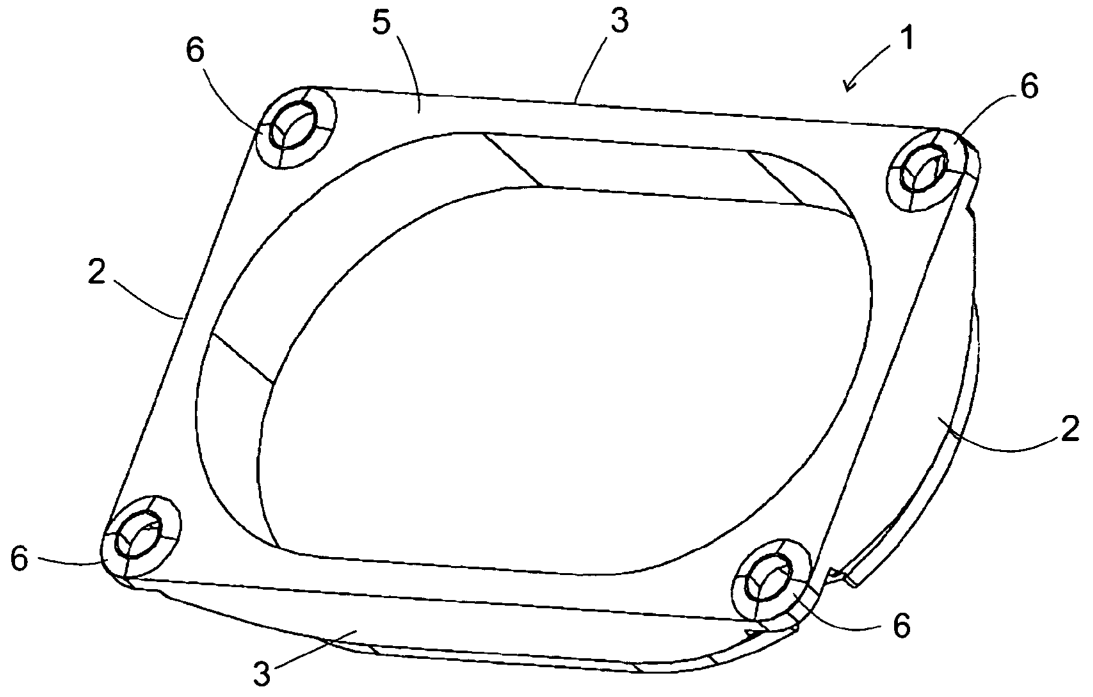
FIG. 2 is a perspective rear view of the mounting frame of FIG. 1.

FIGS. 1 and 2 show front and rear sides of a loudspeaker mounting frame 1 according to a first embodiment of the invention. The frame 1 is integrally formed by injection moulding of plastic material. It has four webs 2, 2, 3, 3 defining the sides of a rectangle with rounded corners and surrounding a central opening 4. Its rear side 5 is essentially flat, except for spherical bosses 6 at four corners.

At the front side of the frame 1, a flat rim 7 extends around the central opening 4.

The rim 7, in turn, is surrounded by ribs 8. The ribs 8 are shaped so that a support ring of a loudspeaker, not shown, may be placed on the rim 7 and held in place by the ribs 8.

In the corners of the front side of the mounting frame 1, there are four recesses 9, each of which has a flat base surface 10. The base surfaces 10 of all recesses are in one plane, parallel to the two planes defined by the rim 7 and the rear side 5, respectively. A tapered hole 11 extends from the base surface 10 of each recess to the bosses 6 at the rear side 5. The tapering angle of the holes 11 is 5° to 15°, preferably about 10°. The narrow side of the holes 11 is at rear side 5.

Figure 3:
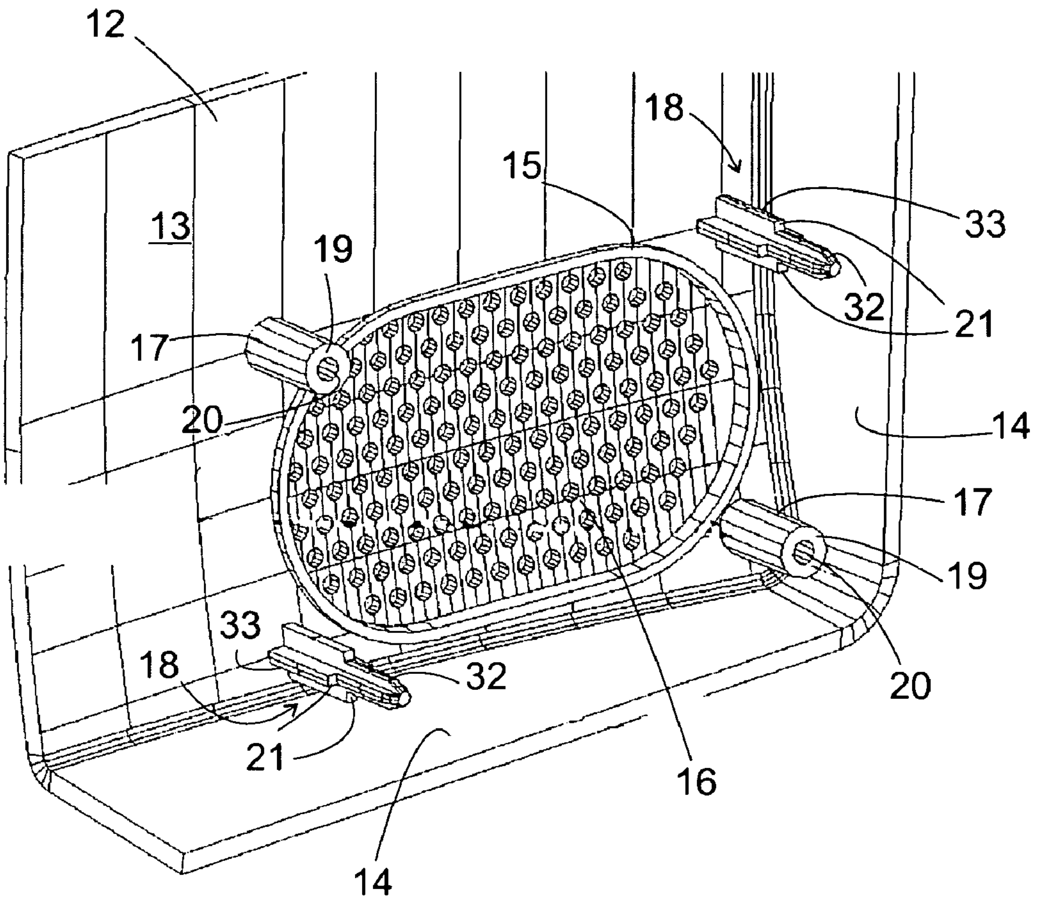
FIG. 3 shows part of a cabinet element for an electronic appliance.

The purpose of the mounting frame 1 is to facilitate mounting a loudspeaker to a cabinet element of an electronic appliance. FIG. 3 is a perspective view of part of such a cabinet element 12, seen from inside. In the Figure, part of a main surface 13 and lateral flanks 14 of the cabinet element 12 are shown. The main surface 13 has a convex curvature. An oval rib 15 delimits a perforated surface portion 16 of the main surface 13. Behind this perforated surface portion 16, a loudspeaker is to be installed. The outline of rib 15 is adapted to that of ribs 8 so that the ribs 8 can matingly engage inside the rib 15, whereby a support ring of a loudspeaker is held fixed between rim 7 and the perforated surface portion 16 facing it.

For fixing the mounting frame 1 to the cabinet element 12, four stubs 17, 18 are formed at the inside of main surface 13, surrounding rib 15. Two of these stubs 17 are cylinders having flat end faces 19. In these, a blind bore 20 is formed coaxially to the stub 17.

The other two stubs 18 have a cross-shaped cross section with resting shoulders 21 formed therein between base portions 33 and tip portions 32 thereof. The resting shoulders 21 and the end faces 19 are located in the same plane.

Figure 4:
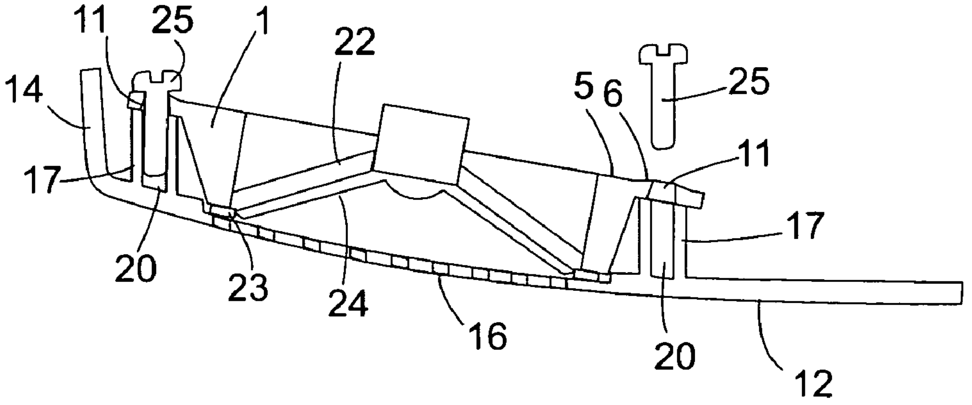
FIG. 4 is a section of the cabinet element of FIG. 3 with a loudspeaker and a mounting frame mounted to it.

FIG. 4 is a section of cabinet element 12 in a plane extending through the two stubs 17, and of the mounting frame 1 and a loudspeaker 22 mounted to the cabinet element 12. An angular support ring 23 of the loudspeaker is held tight between the cabinet element 12 and the mounting frame 1. It supports the outer rim of a loudspeaker membrane 24. The mounting frame 1 is held in place by two screws 25 extending through two of the tapered holes 11 and engaging the blind bores 20 of stubs 17. The other two tapered holes 11 (not shown in FIG. 4) are engaged by the tip portions 32 of stubs 18. It is readily apparent that the stubs 17 (and 18, too) are not perpendicular to the perforated surface portion 16, but extend at an oblique angle. The reason for this is that the cabinet element 12 is formed by injection moulding in a two part mould, and that the direction of the stubs 17, 18 is defined by the direction in which the parts of the mould move with respect to each other when disengaging and releasing the cabinet element 12. Accordingly, the rear side 5 of frame 1 is not perpendicular to the stubs 17, 18 and to the engaging direction of the screws 25, either. Due to the tapered shape of the holes 11, it is not difficult to insert the screws 25, although the diameter of the narrow ends of the holes need not be much larger than that of the screw shaft. Due to the tilted orientation of the screw 25, not all of the rear side of the screw head can come into contact with the frame 1. If the rear side 5 of the mounting frame 1 were flat, only a point at the circumference of the screw head would be able to touch the frame 1, and the screw 25 would be subject to a torque tending to rotate it clockwise in FIG. 4. By providing the bosses 6, the point of contact between the screw head and the frame 1 is moved close to the shaft of the screw 25, so that the torque acting on the screw 25 is reduced. Accordingly, a shorter thread of the screw 25 is sufficient for a solid fixation. In consequence, the screws 25 and the stubs 17, 18 may be made short, and space inside the cabinet may be saved.

Space is also saved by the fact that the holes 11 are formed at the bottom of recesses 9. The depth of these recesses 9 is equal to the length of the stubs 17 and of the base portions 33, so that these may be accommodated within the recesses 9, and the support ring of the loudspeaker is held in direct contact with the perforated surface portion 16.

Figure 5:
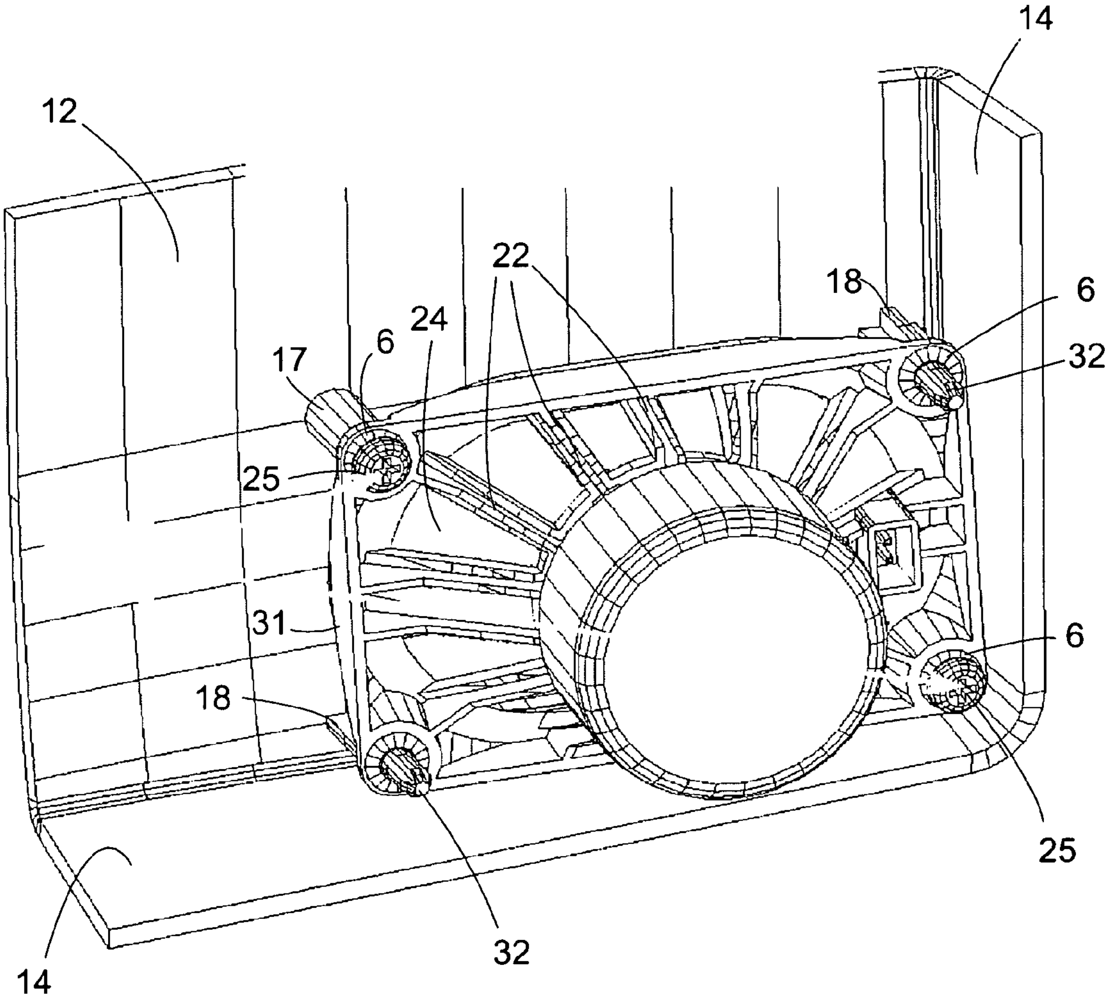
FIG. 5 is a perspective view of the cabinet element of FIG. 3 with a loudspeaker mounted to it, according to a second embodiment of the invention.

FIG. 5 is a perspective view of the cabinet element 12 of FIG. 3, with a loudspeaker 30 according to a second embodiment of the invention mounted to it. In this embodiment, the mounting frame and the support ring supporting the loudspeaker membrane are the same thing and will be referred to as mounting frame 31.

The mounting frame 31 is fixed to the cabinet element 12 in the same way as mounting frame 1 of FIGS. 1, 2. Two of its holes 11 are brought into engagement with tip portions 32 of stubs 18 that extend beyond the resting shoulders 21.

When the base surfaces 10 surrounding these two holes come into contact with the resting shoulders 21 of the stubs 18, the other base surfaces come into contact with the end faces 19 of stubs 17. In this position, the screws 25 are inserted through the remaining holes 11 and brought into engagement with the bores 20 of stubs 17. When the screw heads come into contact with bosses 6, the loudspeaker is solidly held.

What is claimed is:

1. A loudspeaker mounting frame having a central opening for receiving a loudspeaker membrane and a plurality of through holes surrounding said central opening for receiving fixing means, wherein said through holes are tapered, said plurality of through holes that extend between front and rear main surfaces surrounding said central opening for receiving fixing means, wherein said mounting frame has a number of bosses formed on at least one of said main surfaces and said through holes extend through said bosses, and wherein one of said main surfaces has the bosses formed on it and the narrow side each through hole is formed at said one main surface.

2. The loudspeaker mounting frame of claim 1, wherein said through holes have a tapering angle of 5° to 15°.

3. A loudspeaker mounting frame according to claim 1, wherein said bosses are segments of a sphere.

4. A loudspeaker comprising:

a mounting frame having a central opening for receiving a loudspeaker membrane and a plurality of through holes surrounding said central opening for receiving fixing means, wherein said through holes are tapered; and a sound-emitting membrane mounted in the central opening of said mounting frame, said plurality of through holes that extend between front and rear main surfaces surrounding said central opening for receiving fixing means, wherein said mounting frame has a number of bosses formed on at least one of said main surfaces and said through holes extend through said bosses, and wherein one of said main surfaces has the bosses formed on it and the narrow side of each through hole is formed at said one main surface.

5. The loudspeaker according to claim 4, wherein an outer edge of the sound-emitting membrane is connected directly to an edge of said central opening of the mounting frame.

6. The loudspeaker according to claim 4, wherein the sound-emitting membrane is directly connected to a support ring mounted in the central opening of said mounting frame.

7. A loudspeaker cabinet having a support structure to which a loudspeaker mounting frame Is mounted, and a perforated shell facing a sound-emitting membrane, the loudspeaker mounting frame having a central opening for receiving a loudspeaker membrane and a plurality of through holes that extend between front and rear main surfaces surrounding said central opening for receiving fixing means wherein said mounting frame has a number of bosses formed on at least one of said main surfaces and said through holes extend through said bosses, wherein said through holes are tapered, and wherein one of said main surfaces has the bosses formed on it and the narrow side of each through hole is formed at said one main surface.

8. The loudspeaker cabinet according to claim 7, wherein said support structure has at least one tip portion matingly engaging one of said through holes and at least one bore aligned with another one of said through holes for receiving a fixing bolt inserted through said through holes.

9. A loudspeaker cabinet having a support structure to which a loudspeaker mounting frame is mounted, and a perforated shell facing a sound-emitting membrane, the loudspeaker mounting frame having a central opening for receiving a loudspeaker membrane and a plurality of through holes that extend between front and rear main surfaces surrounding said central opening for receiving fixing means, wherein said mounting frame has a number of bosses formed on at least one of said main surfaces and said through holes extend through said bosses, wherein said support structure has at least one tip portion matingly engaging one of said through holes and at least one bore alleged with another one of said through holes for receiving a fixing bolt inserted through said through holes, and wherein said fixing bolt has a shaft extending through said through hole and a head having a diameter which is greater than;that of the through hole, and the boss is in contact with the head of the bolt.

10. The loudspeaker cabinet according to claim 9, wherein said support structure Is Integrally formed with the perforated shelf.

11. The loudspeaker cabinet according to claim 10, wherein said support structure comprises a number of stubs formed on a cabinet element, the mounting frame is held in contact with resting surfaces of these stubs, the at least one tip portion and the at least one bore each being formed at one of said resting surfaces.

12. The loudspeaker cabinet according to claim 11, wherein the mounting frame has a mounting surface portion surrounding the central opening, and said surface portion is located between a plane defined by the resting surfaces of said stubs and the perforated shell.

* * * * *